(12) United States Patent
Tachikawa et al.

(10) Patent No.: US 7,736,921 B2
(45) Date of Patent: Jun. 15, 2010

(54) METHOD FOR MANUFACTURING ELECTROLUMINESCENT ELEMENT

(75) Inventors: Tomoyuki Tachikawa, Tokyo (JP); Norihito Ito, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 489 days.

(21) Appl. No.: 10/763,657

(22) Filed: Jan. 23, 2004

(65) Prior Publication Data

US 2004/0152223 A1 Aug. 5, 2004

(30) Foreign Application Priority Data

Jan. 24, 2003 (JP) .............................. 2003-016762

(51) Int. Cl.
*H01L 21/00* (2006.01)
(52) U.S. Cl. .................. 438/29; 438/946; 438/976; 430/321; 257/E21.038
(58) Field of Classification Search .................. 438/29, 438/694, 703, 28, 738, 946, 976; 216/41; 430/321, 322, 324; 257/E21.038
See application file for complete search history.

(56) References Cited

U.S. PATENT DOCUMENTS

| | | | |
|---|---|---|---|
| 5,953,585 A | * | 9/1999 | Miyaguchi .................. 438/35 |
| 6,171,765 B1 | | 1/2001 | Sheats |
| 7,147,992 B2 | * | 12/2006 | Itou et al. .................. 430/321 |
| 7,396,637 B2 | * | 7/2008 | Itou et al. .................. 430/321 |
| 2004/0024263 A1 | * | 2/2004 | Boriack et al. .............. 568/729 |

FOREIGN PATENT DOCUMENTS

| | | | |
|---|---|---|---|
| JP | 03-038601 A | | 2/1991 |
| JP | 9293589 A | * | 11/1997 |
| JP | 2000-113981 A | | 4/2000 |
| JP | 2001185356 A2 | * | 7/2001 |
| JP | 2001-237075 | | 8/2001 |
| JP | 2001217078 A2 | * | 8/2001 |
| JP | 2001237075 A2 | * | 8/2001 |
| JP | 2002170673 A | * | 6/2002 |
| WO | WO 97/38445 | | 10/1997 |

* cited by examiner

*Primary Examiner*—Mary Wilczewski
*Assistant Examiner*—Toniae M Thomas
(74) *Attorney, Agent, or Firm*—Ladas & Parry LLP

(57) ABSTRACT

An EL element capable of: preventing the state in which number of excessive layers are laminated on each light emitting part formed in a pattern at the time of forming the light emitting parts using the photolithography method; executing the peeling treatment easily and quickly in the excessive layer peeling process; and preventing generation of color mixture or pixel narrowing derived from the elution of the patterned light emitting part into the light emitting layer coating solution to be coated later, at the end part thereof, at the time of coating a light emitting layer coating solution. In order to achieve the above mentioned object, the present invention provides a method for manufacturing an electroluminescent element using a photolithography method.

15 Claims, 3 Drawing Sheets

METHOD FOR MANUFACTURING ELECTROLUMINESCENT ELEMENT

BACKGROUND OF THE INVENTION

1. Field of the Invention

The present invention relates to a method for manufacturing an electroluminescent (hereinafter, "electroluminescent" may be abbreviated as "EL".) element having a light emitting layer formed by using a photolithography method.

2. Description of the Related Art

The EL element couples a positive hole and an electron injected from facing electrodes in a light emitting layer, excites the fluorescent substance in the light emitting layer by the energy, and emits light of a color corresponding to the fluorescent substance, attracts attention as a flat display element of self light emission. In particular, an organic thin film EL display using an organic substance as the light emitting material has high light emitting efficiency such as realizing light emission with a high luminance with less than 10 V coated voltage and is capable of emitting light with a simple element structure. Thus, application thereof to an inexpensive simple display, which displays a specific pattern by light emission, for advertisement and the like, is expected.

In manufacturing of a display using such EL element, patterning of a first electrode layer and an organic EL layer is usually carried out. As the method for patterning the EL element, a method of vapor depositing the light emitting material via a shadow mask, a method of coating divisionally by ink jet, a method of destroying a specific light emitting pigment by the ultraviolet ray irradiation, screen printing method, or the like can be presented. However, in these methods, an EL element which realizes all of high light emitting efficiency, high light taking out efficiency, manufacturing process simplicity and highly sophisticated pattern formation could not be provided.

As a means for solving these problems, a method for manufacturing an EL element by patterning a light emitting layer by a photolithography method has been proposed. By this method, compared with the conventionally executed patterning method by the vapor deposition, manufacturing can be executed relatively easily and inexpensively since vacuum equipment having a highly accuracy aligning mechanism or the like is not needed. In contrast, compared with the patterning method by the ink jet method, it is preferable in that a pre-process to a structure, a substrate or the like for aiding patterning is not executed. Furthermore, in relation with the discharging accuracy of an ink jet head, the manufacturing method by the photolithography method is more preferable for the highly sophisticated pattern formation, and thus it is advantageous.

Figure 3A:
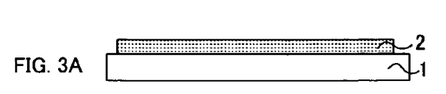
FIGS. 3A to 3N are process diagrams showing conventional methods for manufacturing an EL element.
Figure 3B:
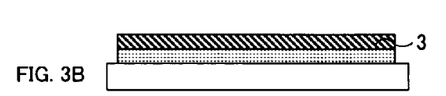
Figure 3C:
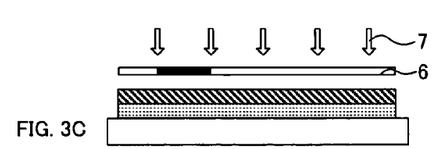
Figure 3D:
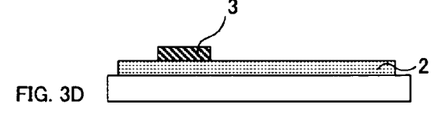
Figure 3E:
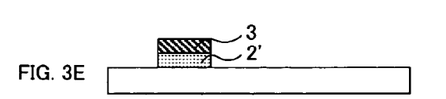
Figure 3F:
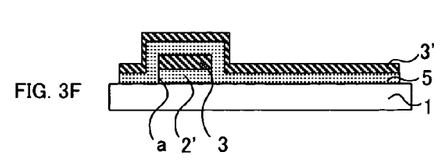
Figure 3G:
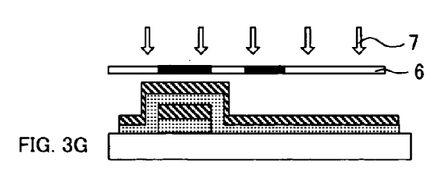
Figure 3H:
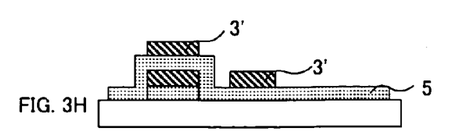
Figure 3I:
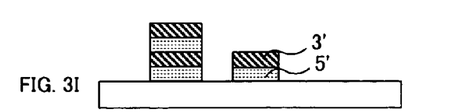
Figure 3J:
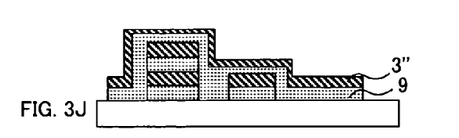
Figure 3K:
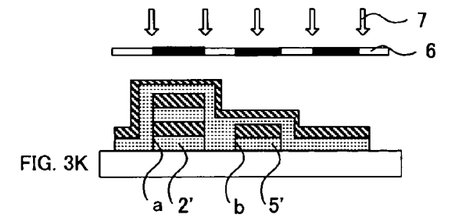
Figure 3L:
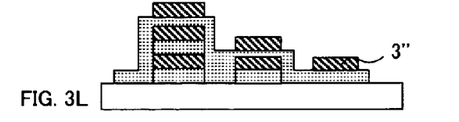
Figure 3M:
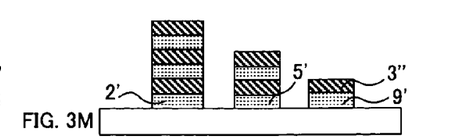
Figure 3N:
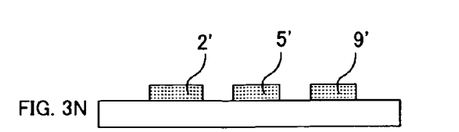

As a method for forming plural light emitting parts by such photolithography method, for example, a method shown in FIGS. 3A to 3N has been proposed.

First, as shown in FIG. 3A, a first light emitting layer coating solution 2 is coated on the entire surface of a substrate 1 having a first electrode layer (not shown in the figure). Next, as shown in FIG. 3B, a positive type resist 3 is coated on the entire surface, and as shown in FIG. 3C, with only the parts, where first light emitting parts are to be formed, masked with a photomask 6, the other parts are exposed to ultraviolet ray 7.

By developing the same with a resist developing agent and cleaning with water, as shown in FIG. 3D, the resist of the exposed parts is removed so that the resist 3 remains only in the unexposed parts. Furthermore, by developing with a solvent of the light emitting layer or the like, as shown in FIG. 3E, the exposed first light emitting layer 2 is removed so that the resist 3 and the first light emitting part 2' covered with the resist 3 remain.

Next, same as the formation of the first light emitting part 2', as shown in FIG. 3F, a second light emitting layer coating solution 5 and a positive type resist 3' are coated on the entire surface. At the time, as it is apparent from FIG. 3F, there is a part where the second light emitting layer coating solution 5 coated on the entire surface and the first light emitting part 2' are in contact. That is, as mentioned above, the surface of the first light emitting part 2' remaining on the substrate 1 is covered with the positive type resist 3, and the end part "a" developed with the light emitting layer developing agent is exposed. Therefore, when the above mentioned second light emitting layer coating solution 5 is coated on the light emitting part 2', the first light emitting part 2' and the second light emitting layer coating solution are contacted at this end part "a". Thereby, there has been a problem of elution of the first light emitting part into the second light emitting layer coating solution so as to generate a trouble of color mixture and pixel narrowing.

Next, as shown in FIG. 3G, with the parts, where the first and second light emitting parts are to be formed, masked with the photomask 6, the other parts are exposed to the ultraviolet ray 7.

By developing the same with the resist developing agent and cleaning with water, as shown in FIG. 3H, the resist 3' of the exposed parts is removed. Furthermore, by developing with the solvent of the light emitting layer, as shown in FIG. 3I, only the exposed second light emitting layer 5 is removed so that a second light emitting part 5' covered with the resist 3 is formed.

Furthermore, same as the formation of the first and second light emitting parts, as shown in FIG. 3J, a third light emitting layer coating solution 9 and a positive type resist 3" are coated. At the time, as it is apparent from FIG. 3J, the first light emitting part and the third light emitting layer coating solution 9 are contacted at the end part "a" of the first light emitting part 2' formed initially, and further, the second light emitting part 5' and the third light emitting layer coating solution 9 are contacted at the end part "b" of the second light emitting part 5'. Therefore, there is a possibility that the first light emitting part 2' and the second light emitting part 5' are eluted into the third light emitting layer coating solution so as to generate a trouble of color mixture and pixel narrowing.

Then, as shown in FIG. 3K, with the parts, the first, second and third light emitting parts are to be formed, masked with the photomask 6, the other parts are exposed to the ultraviolet ray 7. By developing the same with the resist developing agent and cleaning with water, as shown in FIG. 3L, the resist 3" of the exposed part is removed. Further, by developing with the solvent of the light emitting layer, as shown in FIG. 3M, only the exposed third light emitting layer 9 is removed so that a part 9' covered with the resist 3" remains. Then, by coating a peeling treatment with a resist peeling solution, the part with the resist formed thereon and the upper layers thereof are peeled off so that the three color light emitting parts of the first light emitting part 2', the second light emitting part 5' and the third light emitting part 9' are formed as shown in FIG. 3N. By forming a second electrode layer on these light emitting parts, an EL element emitting the EL light toward downward in the figure can be manufactured.

As mentioned above, by the photolithography method, since the end part "a" of the patterned first light emitting part and the end part "b" of the second light emitting part are not covered with the photoresist layer, there has been a problem of elution of the patterned light emitting part into the light emitting layer coating solution to be coated later at the time of coating the subsequent light emitting layer coating solution so as to generate a trouble of color mixture and pixel narrowing at the end part thereof.

Moreover, for example, as shown in FIG. 3M, since plural light emitting layers and the photoresist layers are laminated on the first light emitting layer 2' and the second light emitting layer 5', at the time of coating the peeling treatment to obtain only the light emitting layer, the area of the photoresist layer where contacting to the photoresist peeling solution is minute so that there is a problem that an extremely long time is required for sufficiently providing the effect of the photoresist peeling solution to the photoresist layer. Long time exposure of the substrate to the photoresist peeling solution is not only disadvantageous in terms of the manufacturing efficiency but also a problem of swelling and eluting the pattern formed layer can be generated from the influence of the photoresist peeling solution. Therefore, a method for obtaining a state in which the photoresist peeling solution can easily act at the time of coating the peeling treatment is also required.

SUMMARY OF THE INVENTION

In view of the above mentioned problems, the present invention has been achieved, and the main object thereof is to provide a method for manufacturing an EL element capable of: avoiding a state with a number of excessive layers laminated on each light emitting parts formed in a pattern at the time of forming the light emitting parts using the photolithography method; carrying out the peeling treatment easily and quickly in the peeling process of the excessive layer; and preventing generation of color mixture or pixel narrowing derived from the elution of the patterned light emitting part into the light emitting layer coating solution to be coated later at the end part thereof when coating the light emitting layer coating solution.

In order to achieve the above mentioned object, a first aspect of the present invention provides a method for manufacturing an electroluminescent element using a photolithography method comprising:

a heterochromatic light emitting layer forming process of forming a heterochromatic light emitting layer on a substrate, provided with a light emitting part of at least one color and a protecting layer formed so that the light emitting part and the end part thereof are not bared, by coating a heterochromatic light emitting layer forming coating solution showing a color different from the light emitting part;

a photoresist layer for the heterochromatic light emitting layer forming process of forming a photoresist layer for the heterochromatic light emitting layer by coating a photoresist on the heterochromatic light emitting layer;

a photoresist layer for the heterochromatic light emitting layer patterning process of patterning the photoresist layer for the heterochromatic light emitting layer by pattern exposure and development so as only the photoresist layer for the heterochromatic light emitting layer of a part where the heterochromatic light emitting part is to be formed will remain;

a heterochromatic light emitting part forming process of forming a patterned heterochromatic light emitting part having a photoresist layer for the heterochromatic light emitting layer on the surface by removing the heterochromatic light emitting layer bared by removing the photoresist layer for the heterochromatic light emitting layer;

a protecting layer for the heterochromatic light emitting layer forming process of forming a protecting layer for the heterochromatic light emitting layer by coating a protecting layer forming coating solution so as to cover the heterochromatic light emitting part; and a protecting layer for the heterochromatic light emitting layer patterning process of exposing and developing the protecting layer for the heterochromatic light emitting layer so as not to bare the heterochromatic light emitting part and the end part thereof.

According to the method for manufacturing an EL element using the photolithography method of the present invention, since the protecting layer is formed so as to cover each light emitting part and the end part thereof, when subsequently forming the other kinds of light emitting parts, a problem of the elution of the light emitting part from the end part into the light emitting layer for forming the other kinds of the light emitting parts can be prevented so as to prevent a problem of color mixture or pixel narrowing. Thereby, an EL element having plural kinds of highly sophisticated light emitting parts can be manufactured.

Moreover, at the time of forming the heterochromatic light emitting part of a different color, when the patterning of the heterochromatic light emitting part is completed, the heterochromatic light emitting layer of a different color is not laminated on each light emitting part so that only each protecting layer or only each photoresist layer and each protecting layer can be laminated on each light emitting part. Thereby, when each photoresist layer and each protecting layer are finally peeled off, since the photoresist layer and the protecting layer to be peeled off are placed in the uppermost part, the function of the photoresist peeling solution can be provided easily so that the peeling treatment can be carried out quickly and easily.

In the above mentioned first aspect of the present invention, it is preferable that after the heterochromatic light emitting part forming process, a photoresist for the heterochromatic light emitting layer peeling process of peeling off the photoresist layer for the heterochromatic light emitting layer remaining on the heterochromatic light emitting part is carried out, and then, the protecting layer for the heterochromatic light emitting layer forming process is carried out. This is because it may be difficult to form the protecting layer for the heterochromatic light emitting layer preferably when the protecting layer forming coating solution is coated and superimposed on the photoresist layer for the heterochromatic light emitting layer formed preliminarily. Therefore, the protecting layer for the heterochromatic light emitting layer is formed on the entire surface after preliminarily removing the photoresist layer for the heterochromatic light emitting layer.

Moreover, a second aspect of the present invention provides a method for manufacturing an electroluminescent element using a photolithography method comprising:

a second light emitting layer forming process of forming a second light emitting layer by coating a second light emitting layer forming coating solution on a substrate provided with a first light emitting part and a first protecting layer formed so as not to bare the first light emitting part and the end part thereof;

a photoresist layer for the second light emitting layer forming process of forming a photoresist layer for the second light emitting layer by coating a photoresist on the second light emitting layer;

a photoresist layer for the second light emitting layer patterning process of patterning by pattern exposure and development of the photoresist layer for the second light emitting layer so as only the photoresist layer for the second light emitting layer of a part where the second light emitting part is to be formed will remain;

a second light emitting part forming process of forming a patterned second light emitting part having a photoresist layer for the second light emitting layer on the surface by removing the second light emitting layer bared by removing the photoresist layer for the second light emitting layer;

a second protecting layer forming process of forming a second protecting layer by coating a protecting layer forming coating solution so as to cover the second light emitting part;

a second protecting layer patterning process of exposing and developing the second protecting layer so as not to bare the second light emitting part and the end part thereof;

a third light emitting layer forming process of forming a third light emitting layer on a substrate, provided with the first light emitting part, the first protecting layer formed so that the first light emitting part and the end part thereof are not bared, the second light emitting part and the second protecting layer formed so that the second light emitting part and the end part thereof are not bared, by coating a third light emitting layer forming coating solution;

a photoresist layer for the third light emitting layer forming process of forming a photoresist layer for the third light emitting layer by coating a photoresist on the third light emitting layer;

a photoresist layer for the third light emitting layer patterning process of patterning the photoresist layer for the third light emitting layer by pattern exposure and development so as only the photoresist layer for the third light emitting layer of a part where the third light emitting part is to be formed will remain; and a third light emitting part forming process of forming a patterned third light emitting part having a photoresist layer for the third light emitting layer on the surface by removing the third light emitting layer bared by removing the photoresist layer for the third light emitting layer.

According to the method for manufacturing an EL element of the present invention, since each protecting layers are formed so as not to bare each light emitting parts and the end parts thereof, problems such as generation of color mixture or pixel narrowing derived from the elution of the light emitting part from the end part into the light emitting layer forming other kind of light emitting part, at the time of subsequently forming other kinds of light emitting part, can be prevented.

Moreover, the present invention is characterized in that at the time of patterning the second color light emitting layer, only the photoresist layer at the position where the second color light emitting part is to be formed remains. Moreover, this is also the same in patterning of the third color light emitting layer. Thereby, when the patterning of each light emitting layer is completed, the light emitting layer other than the light emitting part is not laminated so that only the protecting layer, or only the protecting layer and the photoresist layer can be laminated on each light emitting part. Therefore, when the photoresist layer is finally peeled off, the photoresist peeling solution can function promptly to the photoresist layer or the protecting layer so that the manufacturing efficiency can be improved in manufacturing a full color EL element. Moreover, since the substrate is not needed to be exposed to the photoresist peeling solution for a long time, the influence of the peeling solution to the substrate or the like can be lowered to the minimum degree so that the yield improving effect can be achieved as well.

In the above mentioned second aspect of the present invention, it is preferable that after the second light emitting part forming process, a photoresist for the second light emitting layer peeling process of peeling off the photoresist layer for the second light emitting layer remaining on the second light emitting part is carried out, and then, the second protecting layer forming process is carried out. This is because it may be difficult to form the photoresist layer preferably when the protecting layer forming coating solution is coated and superimposed on the photoresist layer for the second light emitting layer formed preliminarily. Therefore, after removing the photoresist layer preliminarily, the photoresist layer is formed on the entire surface.

In the above mentioned present invention, it is preferable that each light emitting part is patterned together with buffer layers and formed on the buffer layers. The buffer layer is at least one layer provided in between the first electrode layer and the light emitting layer, comprising a charge injecting layer, a charge transporting layer, a charge blocking layer or the like, or it may be a laminated body thereof. Thereby, the charge injection to the light emitting layer can be executed efficiently. Further, the protrusion of the charge injected from the electrode to the facing electrode side can be prevented so as to efficiently couple the injected charges thereby contributing to the light emission. Therefore, by providing the buffer layer, the charge injection efficiency and the coupling efficiency can be improved so as to lead to the improvement of the light emission efficiency.

In the above mentioned present invention, in the above mentioned method for manufacturing electroluminescent using a photolithography, it is preferable that each light emitting part forming process is a process of patterning each light emitting layer of a part where each photoresist layer is removed by using dry etching. By thus using the dry etching at the time of patterning the light emitting layers, the influence of the patterning to the layers other than the light emitting layers to be the subject for the pattern formation can be reduced so that a further highly sophisticated El element can be manufactured.

In the above mentioned present invention, the dry etching may be a reactive ion etching. Thereby, the light emitting layer or the buffer layer can be removed effectively.

In the above mentioned present invention, oxygen alone or a gas containing oxygen may be used for the dry etching. Thereby, the light emitting layer or the buffer layer can be removed effectively without imparting an influence on the substrate or the ITO by the oxidation reaction.

In the above mentioned present invention, atmospheric pressure plasma may be used for the dry etching. By using the atmospheric plasma, the vacuum process can be eliminated so that a highly productive patterning is possible.

According to the method for manufacturing an EL element using the photolithography method of the present invention, since the protecting layer if formed so as to cover each light emitting parts and the end parts thereof, at the time of subsequently forming other kinds of the light emitting parts, elution of the light emitting part from the end part to the light emitting layer forming other kinds of the light emitting parts which leads to a problem of the color mixture or the pixel narrowing can be prevented. Thereby, an EL element having plural kinds of highly sophisticated light emitting parts can be manufactured.

Moreover, when the patterning of the heterochromatic light emitting part is completed at the time of forming a heterochromatic light emitting part of a different color, the heterochromatic light emitting layer of a different color is not laminated on each light emitting part so that only each protecting layer, or each photoresist layer and each protecting layer can be laminated on each light emitting part. Thereby, when each photoresist layer and each protecting layer are finally peeled off, the function of the photoresist peeling solution can be provided easily so that the peeling treatment can be executed quickly and easily since the photoresist layer and the protecting layer to be peeled off are placed at the uppermost part.

DESCRIPTION OF THE PREFERRED EMBODIMENTS

Hereinafter, the method for manufacturing an EL element of the present invention will be explained.

The method for manufacturing an EL element of the present invention is a method for manufacturing an electroluminescent element using a photolithography method comprising:

a heterochromatic light emitting layer forming process of forming a heterochromatic light emitting layer on a substrate, provided with a light emitting part of at least one color and a protecting layer formed so that the light emitting part and the end part thereof are not bared, by coating a heterochromatic light emitting layer forming coating solution showing a color different from the light emitting part;

a photoresist layer for the heterochromatic light emitting layer forming process of forming a photoresist layer for the heterochromatic light emitting layer by coating a photoresist on the heterochromatic light emitting layer;

a photoresist layer for the heterochromatic light emitting layer patterning process of patterning the photoresist layer for the heterochromatic light emitting layer by pattern exposure and development so as only the photoresist layer for the heterochromatic light emitting layer of a part where the heterochromatic light emitting part is to be formed will remain;

a heterochromatic light emitting part forming process of forming a patterned heterochromatic light emitting part having a photoresist layer for the heterochromatic light emitting layer on the surface by removing the heterochromatic light emitting layer bared by removing the photoresist layer for the heterochromatic light emitting layer;

a protecting layer for the heterochromatic light emitting layer forming process of forming a protecting layer for the heterochromatic light emitting layer by coating a protecting layer forming coating solution so as to cover the heterochromatic light emitting part; and a protecting layer for the heterochromatic light emitting layer patterning process of exposing and developing the protecting layer for the heterochromatic light emitting layer so as not to bare the heterochromatic light emitting part and the end part thereof.

Here, the above mentioned "heterochromatic light emitting layer" is a light emitting layer showing a color different from that of the light emitting part which is already pattern formed.

For example, when a red light emitting part is already formed on a substrate, it denotes a light emitting layer showing green or blue color. Furthermore, when the two light emitting parts of red and green are already formed on a substrate, it denotes a light emitting layer showing blue color. Furthermore, the "heterochromatic light emitting layer forming coating solution" is a coating solution to be used when forming such a heterochromatic light emitting layer.

In the above mentioned method for manufacturing an EL element, the light emitting part patterning process for the second and subsequent color is described as a heterochromatic light emitting layer, a heterochromatic light emitting layer forming coating solution, a heterochromatic light emitting part, a photoresist layer for the heterochromatic light emitting layer, and a protecting layer for the heterochromatic light emitting layer. Hereinafter, as a specific example thereof, the patterning process for each light emitting part in the EL element comprising three color light emitting parts will be explained in the order of the formation.

In the description below, the manufacturing method of a case of having full color EL element of the present invention will be explained. Therefore, in the below explanations, the heterochromatic light emitting layer is described as a second or third light emitting layer, the heterochromatic light emitting layer forming coating solution as a second or third light emitting layer forming coating solution, the heterochromatic light emitting part as a second or third light emitting part, the photoresist layer for the heterochromatic light emitting layer as a photoresist layer for the second or third light emitting layer, and the protecting layer for the heterochromatic light emitting layer as a second protecting layer.

That is, such method for manufacturing an EL element is a method comprising: a second light emitting layer forming process of forming a second light emitting layer by coating a second light emitting layer forming coating solution on a substrate provided with a first light emitting part and a first protecting layer formed so as not to bare the first light emitting part and the end part thereof;

a photoresist layer for the second light emitting layer forming process of forming a photoresist layer for the second light emitting layer by coating a photoresist on the second light emitting layer;

a photoresist layer for the second light emitting layer patterning process of patterning by pattern exposure and development of the photoresist layer for the second light emitting layer so as only the photoresist layer for the second light emitting layer of a part where the second light emitting part is to be formed will remain;

a second light emitting part forming process of forming a patterned second light emitting part having a photoresist layer for the second light emitting layer on the surface by removing the second light emitting layer bared by removing the photoresist layer for the second light emitting layer;

a second protecting layer forming process of forming a second protecting layer by coating a protecting layer forming coating solution so as to cover the second light emitting part;

a second protecting layer patterning process of exposing and developing the second protecting layer so as not to bare the second light emitting part and the end part thereof;

a third light emitting layer forming process of forming a third light emitting layer on a substrate, provided with the first light emitting part, the first protecting layer formed so that the first light emitting part and the end part thereof are not bared, the second light emitting part and the second protecting layer formed so that the second light emitting part and the end part thereof are not bared, by coating a third light emitting layer forming coating solution;

a photoresist layer for the third light emitting layer forming process of forming a photoresist layer for the third light emitting layer by coating a photoresist on the third light emitting layer;

a photoresist layer for the third light emitting layer patterning process of patterning the photoresist layer for the third light emitting layer by pattern exposure and development so as only the photoresist layer for the third light emitting layer of a part where the third light emitting part is to be formed will remain; and a third light emitting part forming process of forming a patterned third light emitting part having a photoresist layer for the third light emitting layer on the surface by removing the third light emitting layer bared by removing the photoresist layer for the third light emitting layer.

In particular, the present invention is characterized in that when the photoresist layer is pattern exposed in the photoresist layer for the second light emitting layer patterning process, the pattern exposure is carried out so that the photoresist layer remains only in the part where the second color light emitting part is to be formed. The above is same for the patterning process for the third color light emitting part.

Conventionally, at the time of pattern exposure, for example as shown in FIGS. 3C and 3G, the light emitting part already formed in a pattern is also the subject for the exposure, in addition to the position where the light emitting part to be patterned is to be formed.

However, in the present invention, as mentioned above, since the light emitting part already formed in a pattern is exposed without being masked, for example, by the photomask, no more unnecessary photoresist layer is laminated on the light emitting part already patterned. Therefore, when the patterning of each light emitting part is completed, a light emitting layer showing a color different thereof is not laminated on each light emitting part. Further, a condition, in which only the protecting layer or only the protecting layer and the photoresist layer are laminated on the light emitting part, can be obtained. Thereby, when the photoresist layer and the protecting layer are peeled off afterwards, since the photoresist layer or the protecting layer to be peeled off is placed in the uppermost part, the area which contacts to the photoresist peeling solution used for the peeling treatment can be ensured sufficiently so that quick peeling is enabled.

Moreover, since the first protecting layer is formed on the substrate so as not to bare the first light emitting part and the end part thereof, in the process of forming the second light emitting part and in the process of forming the third light emitting part, a problem of generating the color mixture or the pixel narrowing derived from the elution of the first light emitting part into the second or third light emitting layer or the like can be prevented. Moreover, as to the second light emitting part, since the second protecting layer is formed so as not to bare the second light emitting part and the end part thereof in the second protecting layer forming process and in the second protecting layer patterning process after the second light emitting part forming process, the elution of the second light emitting part into the third light emitting layer can be prevented. Thereby, an EL element having plural kinds of highly sophisticated light emitting parts can be manufactured.

In the present invention, the "light emitting layer" denotes a layer formed by coating a light emitting layer forming coating solution and drying, and the "light emitting part" denotes the light emitting layer formed at a predetermined position.

Figure 1A:
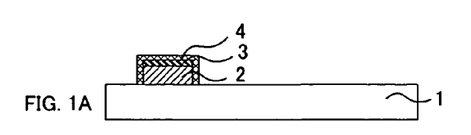
FIGS. 1A to 1N are process diagrams showing an example of a method for manufacturing an EL element of the present invention.
Figure 1B:
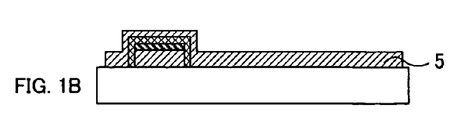
Figure 1C:
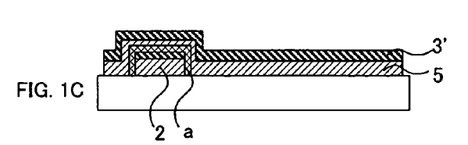
Figure 1D:
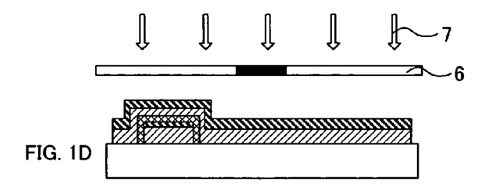
Figure 1E:
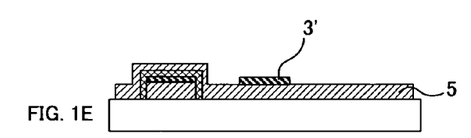
Figure 1F:
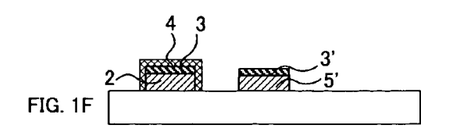
Figure 1G:
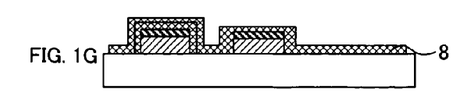
Figure 1H:
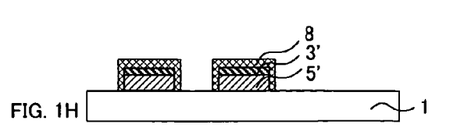
Figure 1I:
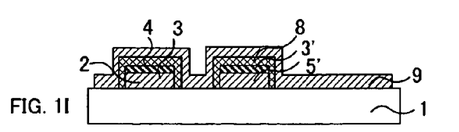
Figure 1J:
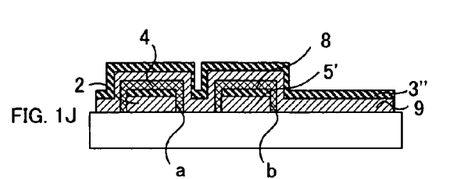
Figure 1K:
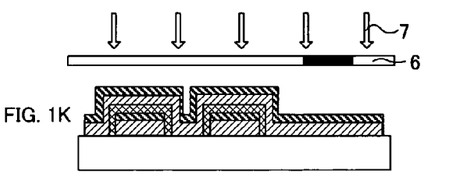
Figure 1L:
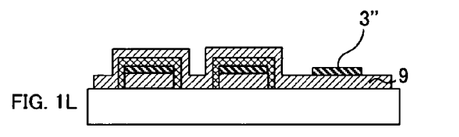
Figure 1M:
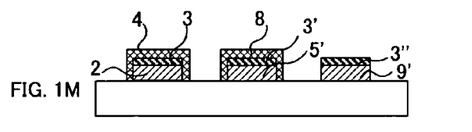
Figure 1N:
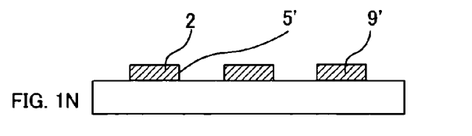

FIGS. 1A to 1N show an example of the manufacturing process for an EL element of the present invention with these characteristics. Hereinafter, with reference to FIGS. 1A to 1N, it will be explained specifically.

In this example, as shown in FIG. 1A, a substrate 1 provided with a first electrode layer (not shown in the figure), a first light emitting part 2, a first photolithography layer 3 formed on the first light emitting part 2 and a first protecting layer 4 formed so as to cover the first light emitting part and the end part thereof, is first prepared. In the present invention, for the patterning of the first light emitting part 2 and the first protecting layer 4, the ordinarily executed photolithography method can be used. Here, in the present invention, the substrate 1 not having the first photolithography layer 3 may be used as well.

Next, by coating the second light emitting layer forming coating solution, a second light emitting layer 5 is formed (second light emitting layer forming process, FIG. 1B). Further, by coating the positive type photoresist on the entire surface thereon, a photoresist layer for the second light emitting layer 3' is formed (photoresist layer for the second light emitting layer forming process, FIG. 1C). At the time, since the first light emitting part 2 and the end part "a" thereof are protected by the first protecting layer 4, it is not contacted with the second light emitting layer 5 so that the elution of the first light emitting part 2 from the end part "a" into the second light emitting layer 5 can be prevented.

Next, as shown in FIG. 1D, with only the position, where the second light emitting part is to be formed, masked with a photomask 6, the position other than the part, where the second light emitting part is to be formed, is exposed to an ultraviolet ray 7. The photoresist layer for the second light emitting layer 3' is developed with a photoresist developing agent, and cleaned. Thereby, the photoresist layer for the second light emitting layer 3' remains only in the part where the second light emitting part is to be formed (photoresist layer for the second light emitting layer patterning process, FIG. 1E).

Furthermore, by removing the second light emitting layer 5 bared by removing the photoresist layer for the second light emitting layer 3', the second light emitting part 5' covered with the photoresist layer for the second light emitting layer 3' and the first light emitting part 2 covered with the first protecting layer 4 and the first photoresist layer 3 remain on the substrate 1 (second light emitting part forming process, FIG. 1F).

Next, as shown in FIG. 1G, by coating a protecting layer forming coating solution so as to cover the second light emitting part, a second protecting layer 8 is formed (second protecting layer forming process). Furthermore, by exposing and developing the second protecting layer 8 so as not to bare the second light emitting layer and the end part thereof, the second protecting layer 8 covering the second light emitting part 5' and the end part "b" thereof is formed (second protecting layer patterning process, FIG. 1H).

Next, the third color light emitting part is patterned. A third light emitting layer 9 is formed by coating a third light emitting layer forming coating solution, as shown in FIG. 1I, on the substrate 1 provided with the first photolithography layer 3, the first light emitting part 2 covered with the first protecting layer 4 formed so as to cover the first light emitting part 2 and the end part thereof, the photoresist layer for the second light emitting layer 3', and the second light emitting part 5' covered with the second protecting layer 8 formed so as to cover the second light emitting part 5' and the end part thereof (third light emitting layer forming process). Furthermore, by coating the positive type photoresist thereon, a photoresist layer for the third light emitting layer 3" is formed (photoresist layer for the third light emitting layer forming process, FIG. 1J). At the time, since the first light emitting part 2 and the end part "a" thereof, and the second light emitting part 5' and the end part "b" thereof are protected by the first protecting layer 4 and the second protecting layer 8, the first light emitting part 2 and the second light emitting part 5' are not contacted with the third light emitting layer 9. Thereby, the elution of the first light emitting part 3 and the second light emitting part 5' from the end parts "a" and "b" into the third light emitting layer 9 can be prevented.

Next, as shown in FIG. 1K, with only the position where the third light emitting part is to be formed masked with the photomask 6, the area other than the masked area is exposed to the ultraviolet ray 7, developed with the photoresist developing agent and cleaned. Thereby the photoresist layer for the third light emitting layer 3" placed in the area other than the area where the third light emitting part is to be formed is removed (photoresist layer for the third light emitting layer patterning process, FIG. 1L).

Next, by removing the third light emitting layer 9 bared by removing the photoresist layer for the third light emitting layer 3", the third light emitting part 9' having the photoresist layer for the third light emitting layer 3" on the surface remains (third light emitting part forming process, FIG. 1M).

In the present invention, since the pattern exposure is executed only to the position where the third light emitting part is to be formed, via the photomask, in the photoresist layer for the third light emitting layer patterning process, a condition can be obtained in which one layer of the photoresist layer for the first light emitting layer 3 and the first protecting layer 4 are laminated on the first light emitting part 2, and furthermore, one layer of the photoresist layer for the second light emitting layer 3' and the second protecting layer 8 are laminated on the second light emitting part 5'.

Finally, as shown in FIG. 1N, by peeling off each photoresist layer and the protecting layer placed on the uppermost layer (peeling process), and by forming the second electrode layer on each bared light emitting layer, the EL element which emits light downward direction of the figure can be manufactured.

Here, in the present invention, it is possible to execute the second protecting layer forming process of forming the second protecting layer after executing the photoresist layer for the second light emitting layer peeing process of peeling off the photoresist layer for the second light emitting layer remaining on the second light emitting part after the above mentioned second light emitting part forming process. The method for manufacturing an EL element in this case will be explained with reference to FIGS. 2A to 2O.

Figure 2A:
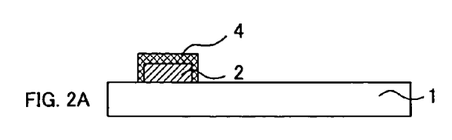
FIGS. 2A to 2O are process diagrams showing another example of a method for manufacturing an EL element of the present invention.
Figure 2B:
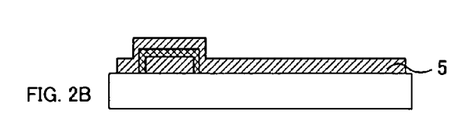
Figure 2C:
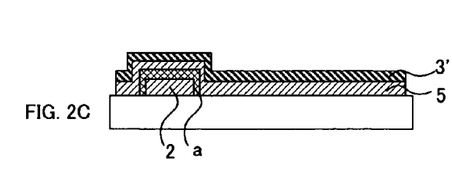

First, the substrate 1 provided with the first electrode layer (not shown in the figure), a first light emitting part 2, and the first protecting layer 4 formed so as to cover the first light emitting part and the end part thereof is prepared (FIG. 2A). Then, in the same manner as mentioned above, the second light emitting layer forming coating solution is coated to form the second light emitting layer 5 (second light emitting layer forming process FIG. 2B). Furthermore, by coating the positive type photoresist on the entire surface thereof, the photoresist layer for the second light emitting layer 3' is formed (photoresist layer for the second light emitting layer forming process, FIG. 2C).

Figure 2D:
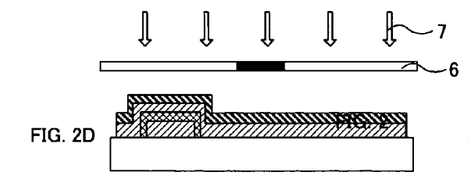

Next, as shown in FIG. 2D, in the same manner as mentioned above, with only the position where the second light emitting part is to be formed masked with the photomask 6, the position other than the position where the second light emitting part is to be formed is exposed to the ultraviolet ray 7, and the photoresist layer for the second light emitting layer 3' is developed with the photoresist developing agent and cleaned. Thereby, the photoresist layer for the second light emitting layer 3' remains only in the part where the second light emitting part is to be formed (photoresist layer for the second light emitting layer patterning process, FIG. 2E).

Figure 2F:
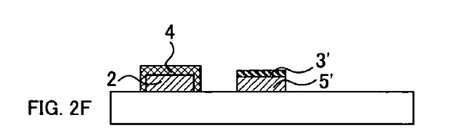

Furthermore, by removing the second light emitting layer 5 bared by removing the photoresist layer for the second light emitting layer 3', the second light emitting part 5' covered with the photoresist layer for the second light emitting layer 3', and the first light emitting part 2 covered with the first protecting layer 4 remain on the substrate 1 (second light emitting part forming process, FIG. 2F).

Figure 2G:
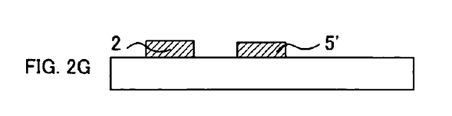

Here, by peeling off the photoresist layer for the second light emitting layer 3' on the above mentioned second light emitting part 5', the second light emitting layer 5' is bared (photoresist layer for the second light emitting layer peeling process, FIG. 2G). This process is executed because the preferable formation of the second protecting layer may be difficult when the protecting layer forming coating solution is coated and superimposed on the photoresist layer for the second light emitting layer 3' in the subsequent process. In general, at the time, the first protecting layer 4 formed on the first light emitting part 2 is peeled off together with the above mentioned photoresist layer for the second light emitting layer 3'.

Figure 2H:
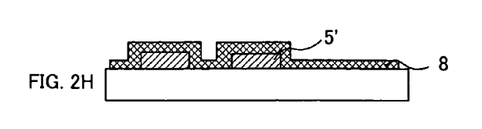

Subsequently, as shown in FIG. 2H, by coating the protecting layer forming coating solution so as to cover the first light emitting part 2 and the second light emitting part 5' bared in the above mentioned process, the second protecting layer 8 is formed (second protecting layer forming process). Furthermore, the second protecting layer 8 is exposed and developed so as not to bare the first and second light emitting layers and the end parts thereof. Thereby, the second protecting layer 8 covering the first light emitting layer 2 and the end part thereof, and the second light emitting part 5' and the end part thereof, is formed (second protecting layer patterning process, FIG. 2I). The second protecting layer formed on the first light emitting part 2 and the second protecting layer formed on the second light emitting part may be provided continuously.

Figure 2I:
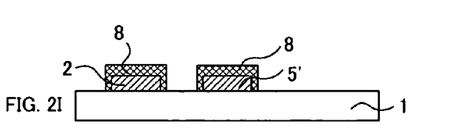
Figure 2J:
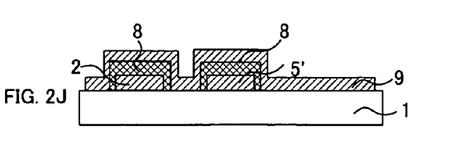
Figure 2K:
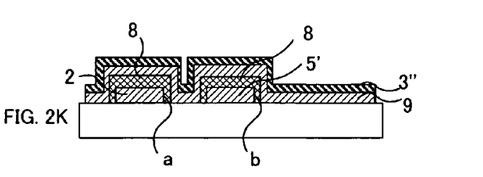

Next, the third color light emitting part patterning is executed. Onto the substrate 1 provided with the first light emitting part 2 covered with the second protecting layer 8 formed so as to cover the first light emitting part 2 and the end part thereof, and the second light emitting part 5' covered with the second protecting layer 8 formed so as to cover the second light emitting part 5' and the end part thereof, as shown in FIG. 2J, the third light emitting layer forming coating solution is coated to form the third light emitting layer 9 (third light emitting layer forming process). Furthermore, by coating the positive type photoresist thereon, a photoresist layer for the third light emitting layer 3" is formed (photoresist layer for the third light emitting layer forming process, FIG. 2K). At the time, since the first light emitting part 2 and the end part "a" thereof, and the second light emitting part 5' and the end part "b" thereof are protected by the second protecting layer 8, the first light emitting part 2 and the second light emitting part 5' are not contacted with the third light emitting layer 9. Thereby, the elution of the first light emitting part 3 and the second light emitting part 5' from the end parts "a" and "b" into the third light emitting layer 9 can be prevented.

Figure 2L:
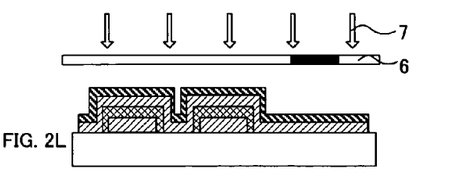
Figure 2M:
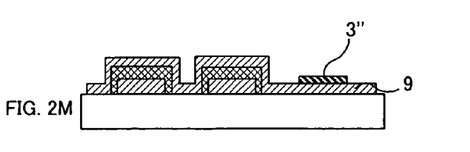

Next, as shown in FIG. 2L, with only the position where the third light emitting part is to be formed masked with the photomask 6, the area other than the masked area is exposed to the ultraviolet ray 7, developed with the photoresist developing agent and cleaned, thereby the photoresist layer for the third light emitting layer 3" placed in the area other than the area where the third light emitting part is to be formed is removed (photoresist layer foe the third light emitting layer patterning process, FIG. 2M).

Figure 2N:
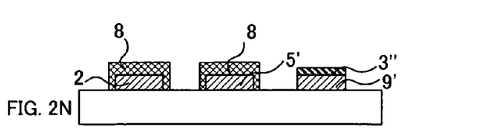

Next, by removing the third light emitting layer 9 bared by removing the photoresist layer for the third light emitting layer 3", the third light emitting part 9' having the photoresist layer for the third light emitting layer 3" on the surface remains (third light emitting part forming process, FIG. 2N).

In the present invention, since the pattern exposure is executed via the photomask only at the position where the third light emitting part is to be formed in the photoresist layer for the third light emitting layer patterning process, a condition can be obtained in that the one layer of the second protecting layer 8 is laminated on the first light emitting part 2 and the second light emitting part 5'.

Figure 2O:
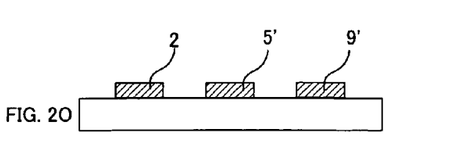

Finally, as shown in FIG. 2O, by peeling off each photoresist layer and the protecting layers placed on the uppermost layer (peeling process), and by forming the second electrode layer on each bared light emitting layer, the EL element which emits light to the downward direction in the figure can be manufactured.

Hereinafter, each process of the method for manufacturing an EL element of the present invention as mentioned above will be explained in detail.

1. Photoresist Layer for the Second Light Emitting Layer Forming Process

First, the photoresist layer for the second light emitting layer forming process in the method for manufacturing an EL element of the present invention will be explained.

The photoresist layer for the second light emitting layer forming process in the present invention is a process of forming the second light emitting layer by coating the second light emitting layer forming coating solution onto the substrate provided with the first light emitting part, and the first protecting layer formed so as to cover the first light emitting part and the end part thereof. Hereinafter, each configuration of this process will be explained.

(Substrate With the First Light Emitting Part and the First Protecting Layer Formed)

First, the substrate with the first light emitting part and the first protecting layer formed which is used in this process will be explained. The structure or the like of the substrate with the first light emitting part and the first protecting layer formed which is used in this process is not particularly limited as long as it is a substrate with the first light emitting part and the first protecting layer formed so as not to bare the first light emitting part and the end part thereof. For example, as shown in FIG. 1A, one having a photoresist layer for the first light emitting layer comprising a photoresist on the first light emitting part may be used. Alternatively one having the first light emitting part formed on the buffer layer or the like can be used as well. Hereinafter, each configuration of the substrate with the first light emitting part and the first protecting layer formed will be explained.

(1) Substrate

First, the substrate used in this process will be explained. The substrate used in this process is not particularly limited as long as each light emitting part and each protecting layer can be formed on the surface, and as long as it has high transparency. An inorganic material such as a glass, a transparent resin or the like can be used.

The above mentioned transparent resin is not particularly limited as long as it can be formed like a film. However, a polymer material having high transparency, relatively high solvent resistance and heat resistance is preferable. Specifically, a polyether sulfone, a polyethylene terephthalate (PET), a polycarbonate (PC), a polyether ether ketone (PEEK), a polyvinyl fluoride (PFV), a polyacrylate (PA), a polypropylene (PP), a polyethylene (PE), an amorphous polyolefin, a fluorine based resin or the like can be presented.

On the above mentioned substrate, in general, the first electrode layer is formed. The first electrode layer is not particularly limited as long as it is one usually used for the EL element.

Here, in general, in the EL element, the first electrode layer is provided preliminarily on the substrate, and the second electrode layer is provided on the light emitting layer, after formation of the light emitting layer. These electrode layers comprise an anode and a cathode, one of the anode and the cathode is transparent or translucent, and as the anode, one made of a conductive material having a large work function, so as to facilitate injection of the positive hole, is preferable. In contrast, as the cathode, a conductive material having a small work function is preferable so as to facilitate injection of the electron. Moreover, plural materials may be mixed. In either of the electrode layers, one having a resistance as small as possible is preferable. In general, a metal material is used, but an organic substance or an inorganic compound may be used as well.

(2) First Light Emitting Part

Next, as the first light emitting part used in this process, a light emitting part ordinarily used for the EL element can be used, and the manufacturing method or the like is not particularly limited. In general, it is formed by the photolithography method. As a method for forming the first light emitting part by the photolithography method, after forming the first light emitting layer by coating the first light emitting layer forming coating solution onto the above mentioned substrate, the positive type photoresist is coated thereon to form the photoresist layer. Then, with only the position where the first light emitting part is to be formed masked with the photomask, pattern exposure is executed, and the photoresist layer is developed with the photoresist developing agent. Thereby, the photoresist layer for the first light emitting layer of the exposed part is removed so that the first light emitting layer placed under there is bared. Next, by removing the bared first light emitting layer, a first light emitting part having a photoresist layer for the first light emitting layer on the surface, for example as shown in FIG. 1A, can be obtained.

Moreover, the first light emitting layer may be formed on the buffer layer. In this case, the buffer layer and the first light emitting part can be formed by patterning the both together.

Since the material and method for forming of the first light emitting part to be formed by the photolithography method, the buffer layer or the like are same as those to be explained for the second light emitting part formation to be described later, explanation is omitted here.

(3) First Protecting Layer

Next, the first protecting layer to be used in this process will be explained. The first protecting layer used in this process is a layer formed so as to cover the above mentioned first light emitting part and the end part thereof.

According to the present invention, since the above mentioned first light emitting part is protected by the first protecting layer so as not to bare the first light emitting part and the end part thereof, even when the second or third light emitting layer forming coating solution to be described later is coated, contact of the first light emitting part and the second or third light emitting layer can be prevented. Thereby, the elution of the first light emitting part into the second or third light emitting layer can be prevented so that a highly sophisticated organic EL element can be manufactured.

As the first protecting layer used in this process, the material or the like is not particularly limited as long as it is a material insoluble to the second light emitting layer forming coating solution and the third light emitting layer forming coating solution to be described layer, and it is a layer which can be peeled off by the photoresist peeling solution. In general, a photoresist ordinarily used for the photolithography method or the like can be used.

Here, in the present invention, the first protecting layer may be one formed on the first photoresist 3 without peeling off the photoresist layer for the first light emitting layer 3 on the first light emitting part 2, for example as shown in FIG. 1A. However, one having the first protecting layer formed after removing the above mentioned photoresist layer for the first light emitting layer as shown in FIG. 2A is preferable. This is because it may be difficult to preferably form the first protecting layer in the case the protecting layer forming coating solution is coated and superimposed on the photoresist layer for the first light emitting layer formed preliminarily.

Since the method for forming and the material of the first protecting layer are same as those to be explained for the formation of the second protecting layer to be described later, explanation is omitted here.

(Second Light Emitting Layer Forming Coating Solution)

Next, the second light emitting layer forming coating solution used in this process will be explained. In this process, the second light emitting layer is formed by coating the second light emitting layer forming coating solution onto the substrate with the above mentioned first light emitting part and the first protecting layer formed.

The second light emitting layer coating solution is generally constituted with the additives such as a light emitting material, a solvent and a doping agent. Hereinafter, each material constituting the light emitting layer forming coating solution will be explained.

(1) Light Emitting Material

The light emitting material used in the present invention is not particularly limited as long as it contains a material for emitting fluorescent light so as to emit light, and it may have a light emitting function and also a positive hole transporting function or an electron transporting function. In the present invention, as it is to be described later, since the light emitting layer is patterned by the photolithography method, it is preferable that the material forming the light emitting layer is a material insoluble to a photoresist solvent, a photoresist developing agent, or a photoresist peeling solution to be described later. Moreover, in this case, it is preferable that a photoresist used when patterning by the photolithography method is a material insoluble to a solvent used for the formation of the light emitting layer.

As the light emitting material, a pigment based material, a metal complex based material, and a polymer based material can be presented.

a. Pigment Based Material

As the pigment based material, a cyclopendamine derivative, a tetraphenyl butadiene derivative, a triphenyl amine derivative, an oxadiazol derivative, a pyrazoloquinoline derivative, a distylyl benzene derivative, a distylyl arylene derivative, a sylol derivative, a thiophene ring compound, a pyridine ring compound, a pelynone derivative, a pelylene derivative, an oligothiophene derivative, a trifumanyl amine derivative, an oxadiazoldimmer, a pyrazoline dimmer or the like can be presented.

b. Metal Complex Based Material

As the metal complex based material, a metal complex having an Al, a Zn, a Be or the like, or a rare earth metal such as a Tb, an Eu, a Dy as a central metal, and having an oxadiazol, a thiadiazol, a phenyl pyridine, a phenyl benzoimidazol, a quinoline structure, or the like as the ligand such as an aluminum quinolinol complex, a benzoquinolinol beryllium complex, a benzoxazol zinc complex, a benzothiazol zinc complex, an azomethyl zinc complex, a porphyline zinc complex, an europium complex or the like can be presented.

c. Polymer Based Material

As the polymer based material, a polyparaphenylene vinylene derivative, a polythiophene derivative, a polyparaphenylene derivative, a polysilane derivative, a polyacetylene derivative, a polyfluolene derivative, a polyvinyl carbazol derivative, a polymer of the above mentioned pigment material or metal complex based light emitting material or the like can be presented.

In the present invention, from the viewpoint of utilizing the advantage of accurate formation of the light emitting layer using the light emitting layer coating solution by the photolithography method, it is preferable to use the above mentioned polymer based material as the light emitting material.

(2) Solvent

As it is apparent from the example shown in FIGS. 1A to 1N, the light emitting layer coating solution is coated on the photoresist layer in some cases. Therefore, as the solvent used for the light emitting layer coating solution, it is preferable to select a solvent having a solubility to the photoresist at 25° C. and 1 atmospheric pressure of 0.001 (g/g solvent) or less, and it is further preferable to select a solvent having a solubility of 0.0001 (g/g solvent) or less. For example, in the case the buffer layer to be described later is dissolved in a polarity solvent of water based, DMF, DMSO, alcohol or the like, and the photoresist is a common novolak based positive type resist, aromatic based solvents such as each isomer and a mixture of a benzene, a toluene and a xylene, each isomer and a mixture of a mesitylene, a tetralin, a p-simene, a cumene, an ethyl benzene, a diethyl benzene, a butyl benzene, a chloro benzene and a dichloro benzene, ether based solvents such as an anisol, a phenetol, a butyl phenyl ether, a tetrahydrofuran, a 2-butanone, a 1,4-dioxane, a diethyl ether, a diisopropyl ether, a diphenyl ether, a dibenzyl ether, a digrime and the like, chloro based solvents such as a dichloro methane, a 1,1-dichloro ethane, a 1,2-dichloro ethane, a trichloro ethylene, a tetrachloro ethylene, a chloroform, a carbon tetrachloride, and a 1-chloro naphthalene and the like, a cyclohexanone, and the like can be presented. A solvent other than the above can also be used as long as it satisfies the conditions, and a solvent mixture of two or more kinds can be used as well.

Moreover, in the present invention, a buffer layer may be provided, and in the case the buffer layer is soluble in a solvent, it is preferable not to dissolve the buffer layer to prevent mixture or dissolution of the buffer layer and the light emitting layer material at the time of forming the light emitting layer and maintaining the light emitting property original to the light emitting material.

From these viewpoints, as the solvent for the light emitting layer coating solution, it is preferable to select a solvent having a solubility to the buffer layer material at 25° C. and 1 atmospheric pressure of 0.001 (g/g solvent) or less, and it is further preferable to select a solvent having a solubility of 0.0001 (g/g solvent) or less.

(3) Additive

To the light emitting layer coating solution used in this process, in addition to the above mentioned light emitting material and solvent, various additives can be added. For example, a doping material can be added for the purpose of improving the light emitting efficiency in the light emitting part, changing the light emitting wavelength or the like. As the doping material, for example, a perylene derivative, a coumarine derivative, a rubrene derivative, a quinacrydone derivative, a squarium derivative, a porphylene derivative, a styryl based pigment, a tetracene derivative, a pyrazoline derivative, a decacyclene, a phenoxazone or the like can be presented.

(Coating of the Second Light Emitting Layer Forming Coating Solution)

Next, coating of the second light emitting layer forming coating solution will be explained. In this process, the above mentioned second light emitting layer forming coating solution is coated on the entire surface of the above mentioned substrate 1, for example as shown in FIG. 1B. The coating method of the second light emitting layer forming coating solution is not particularly limited as long as it is a common method for coating the coating solution on the entire surface. Specifically, a spin coating method, a casting method, a dipping method, a bar coating method, a blade coating method, a roll coating method, a gravure coating method, a flexo printing method, a spray coating method or the like can be used.

2. Photoresist Layer for the Second Light Emitting Layer Forming Process

Next, the photoresist layer for the second light emitting layer forming process in the present invention will be explained. The photoresist layer for the second light emitting layer forming process in the present invention is a process of forming the photoresist layer for the second light emitting layer by coating the photoresist onto the above mentioned second light emitting layer. Although the three kinds of the first, second and third photoresist layers are used in the present invention, they are used for the convenience, and the same photoresist may be used for all of them.

In the present invention, the photoresist layer is laminated on the light emitting layer and the light emitting layer is patterned by the photolithography method. The present invention is characterized by this pattern exposure executed at the time of the light emitting layer patterning process. The photolithography method is a method of forming an optional pattern according to the light irradiation pattern, utilizing the change of the solubility of the light irradiated part of the film by the light irradiation.

Hereinafter, the photoresist and the photoresist coating used in this process will be explained.

(Photoresist)

The photoresist can be used in the present invention can be a positive type or a negative type, and it is not particularly limited. However, one insoluble to the solvent used for formation of the organic EL layer such as the light emitting layer is preferable.

As the specific photoresist to be used, a novolak resin based, a rubber+bisazido based can be presented.

In general, a photoresist solvent is used at the time of coating the above mentioned photoresist, and it is also the same in the present invention. As the photoresist solvent used at the time of coating the above mentioned photoresist, it is preferable to use one which dose not dissolve the organic EL material, such as the light emitting layer material, to prevent mixture or dissolution of the above mentioned organic EL layer such as the light emitting layer and the photoresist material at the time of forming the photoresist, and to maintain the original light emitting property. In consideration of this point, as the photoresist solvent usable in the present invention, it is preferable to select a solvent having a solubility to the organic EL layer forming material such as the light emitting layer forming material at 25° C. and 1 atmospheric pressure of 0.001 (g/g solvent) or less, and it is further preferable to select a solvent having a solubility of 0.0001 (g/g solvent) or less.

For example, as the photoresist solvent usable in the case the buffer layer forming material is dissolved in a water based solvent and the light emitting layer is dissolved in a non polarity organic solvent of an aromatic based one or the like, ketones such as an acetone and a methyl ethyl ketone, cellosolve acetates such as a propylene glycol monoethyl ether acetate, a propylene glycol monomethyl ether acetate, an ethylene glycol monomethyl ether acetate, and an ethylene glycol monoethyl ether acetate, cellosolves such as a propylene glycol monoethyl ether, a propylene glycol monomethyl ether, an ethylene glycol monomethyl ether, and an ethylene glycol monoethyl ether, alcohols such as a methanol, an ethanol, a 1-butanol, a 2-butanol and a cyclohexanol, ester based solvents such as an ethyl acetate, and a butyl acetate, a cyclohexane, a decaline and the like can be presented. A solvent other than the above can also be used as long as it satisfies the conditions, and a solvent mixture of two or more kinds can be used as well.

(Coating of the Photoresist Layer)

Next, coating of the photoresist in this process will be explained. In this process, by coating the above mentioned photoresist onto the above mentioned second light emitting layer, the photoresist layer for the second light emitting layer is formed. The photoresist layer coating method is not particularly limited as long as it is a common method for coating the coating solution on the entire surface. Specifically, the method which can be used at the time of forming the above mentioned second light emitting layer or the like can be used.

3. Second Light Emitting Layer Patterning Process

Next, the second light emitting layer patterning process in the present invention will be explained. The second light emitting layer patterning process in the present invention is a process of patterning so that only the photoresist layer for the second light emitting layer of the part where the second light emitting part is to be formed will remain by the pattern exposure and the development of the above mentioned photoresist layer for the second light emitting layer using for example a photomask or the like.

Thereby, since the photoresist layer for the second light emitting layer does not remain on the first light emitting layer already formed on the substrate, and the second light emitting layer bared by removing the photoresist layer for the second light emitting layer is also removed in the latter process, lamination of the second light emitting layer and the photoresist layer for the second light emitting layer on the first light emitting part can be avoided. Thereby, only the first protecting layer, or the first protecting layer and the photoresist layer are laminated on the first light emitting part.

In this process, first, the photoresist layer pattern exposure is executed via the photomask. As to the exposing method or the like, a commonly used exposing method can be executed.

Moreover, although the photomask for blocking the part corresponding to the second light emitting part is used in the example shown in FIG. 1 since the photoresist layer is a positive type, in the case a negative type photoresist is used, a photomask for exposing only the part corresponding to the above mentioned second light emitting part is used.

Next, the exposed photoresist layer for the second light emitting layer is developed with the photoresist developing agent such that only the photoresist layer for the second light emitting layer in the part where the second light emitting part is to be formed remains.

The photoresist developing agent which can be used for the development is not particularly limited as long as it can dissolve the material forming the above mentioned light emitting layer. Specifically, a commonly used organic alkaline based developing agent can be used. In addition thereto, an inorganic alkaline or an aqueous solution capable of developing the photoresist layer can be used. It is preferable to clean with water after developing the photoresist layer.

As the developing agent usable in the present invention, a developing agent having a solubility to the light emitting layer forming material at 25° C. and 1 atmospheric pressure of 0.001 (g/g developing agent) or less, and it is further preferable to select a developing agent having a solubility of 0.0001 (g/g developing agent) or less.

4. Second Light Emitting Part Forming Process

Next, the second light emitting part forming process in the present invention will be explained. The second light emitting part forming process in the present invention is a process of forming a patterned second light emitting part having the photoresist layer for the second light emitting layer on the surface by removing the second light emitting layer bared by removing the above mentioned photoresist layer for the second light emitting layer.

In the former process, since the photoresist layer for the second light emitting layer remains only in the position where the second light emitting part is to be formed, the second light emitting layer is formed so as to remain only in the area where the second light emitting part is to be formed in this process. Therefore, the photoresist layer for the second light emitting layer and the second light emitting layer are not remained on the first light emitting part already patterned so that the state with an excessive layer laminated on the first light emitting layer can be avoided.

Moreover, the state in which the unnecessary layers placed on the first electrode layer are removed, provides the effect of solving a problem of the film thickness irregularity derived from the lamination of plural layers or the like. Furthermore, since only the protecting layer, or the protecting layer and the photoresist layer to be peeled off later are laminated on the first light emitting part, the effect of quickly executing peeling treatment to the photoresist layer for the first light emitting layer can also be achieved.

For the second light emitting layer forming process, the wet method of using the solvent for dissolving the light emitting layer, and the dry method of using the dry etching can be used. In the present invention, it is preferable to use the dry method without the trouble of color mixture or the like. Hereinafter, each method will be explained.

(Wet Method)

The wet method in this case is a method of dissolving and removing the second light emitting layer by using a solvent capable of dissolving or peeling off the light emitting layer without peeling off the photoresist. As the solvent usable at the time, the above mentioned solvents for the light emitting layer forming coating solution can be used, and in addition thereto, other solvents can be selected as long as it is a solvent satisfying the above mentioned conditions.

Moreover, at the time of removing with the solvent, it can be carried out in an ultrasonic bath. By accordingly using the ultrasonic bath, highly accurate patterning is enabled without the trouble of narrowing of the pattern in the second light emitting part, flow out of the second light emitting part, or the like, and it is preferable in terms of allowing highly accurate patterning in a short time.

In the present invention, the conditions of the ultrasonic used in the ultrasonic bath are preferably execution at a 20 to 100 kilo hertz oscillation frequency for 0.1 to 60 seconds at 25° C. According to the conditions, highly accurate patterning is enabled in a short time.

(Dry Method)

In contrast, the dry method is a method of removing the second light emitting layer in the part, where the photoresist layer for the second light emitting layer is removed, by using the dry etching.

Since the photoresist layer is generally formed considerably thicker than the light emitting layer, the light emitting layer can be removed by dry etching for the entirety.

In this case, the film thickness of the photoresist layer is preferably in a range of 0.1 to 10 μm, and further preferably in a range of 0.5 to 5 μm. According to such film thickness, dry etching with high processing accuracy is enabled while maintaining the resist function of the photoresist.

Since the end part of etching can be made sharper by using the dry etching accordingly, the width of the area with uneven film thickness existing at the end part of the pattern can be made narrower. As a result, the effect of higher accuracy patterning can be provided.

As the dry etching method used in the present invention, the dry etching may be a reactive ion etching. By using the reactive ion etching, the organic film is reacted chemically so as to be a compound having a small molecular weight so that it can be removed from the substrate by vaporization and evaporation, and thus a process with high etching accuracy is enabled in a short time.

Moreover, in the present invention, it is preferable that an oxygen alone or gas containing oxygen is used at the time of the above mentioned dry etching. By using the oxygen alone or the gas containing oxygen, decomposition and removal of the organic film by the oxidation reaction is enabled so that the unnecessary organic substance can be removed from the substrate, and thus a process with high etching accuracy is enabled in a short time. Moreover, according to this condition, since the oxide transparent conductive film ordinarily used such as an ITO is not etched, it is effective also in that the electrode surface can be purified without deteriorating the electrode property.

Furthermore, in the present invention, the atmospheric pressure plasma may be used for the above mentioned dry etching. By using the atmospheric pressure plasma, the dry etching, which generally requires the vacuum equipment, can be executed under the atmospheric pressure so that shortening of the treating time and reduction of the cost can be achieved. In this case, etching can utilize the oxidation and decomposition of the organic substance by the oxygen as the plasma in the atmosphere, but the gas composition in the reaction atmosphere can be adjusted optionally by substitution and circulation of the gas.

5. Second Protecting Layer Forming Process

Next, the second protecting layer forming process in the present invention will be explained. The second protecting layer forming process in the present invention is a process of forming the second protecting layer by coating the protecting layer forming coating solution so as to cover the second light emitting part formed in the above mentioned process. In this process, the second protecting layer is formed on the entire surface, and in the second protecting layer patterning process to be described later, it is formed so as to cover the second light emitting part and the end part thereof. Thereby, contact of the second light emitting part and the third light emitting layer can be prevented at the time of forming the third light emitting part so that the elution of the second light emitting part into the third light emitting layer can be prevented.

The material used for the second protecting layer forming coating solution is not particularly limited as long as it is a material which can be patterned by the second protecting layer patterning process to be described later. From the viewpoint of easy patterning and peeling off by the resist peeling solution used at the time of finally removing each photoresist layer and each protecting layer, it is preferable to use the above mentioned photoresist or the like.

As to the coating method or the like of the second protecting layer in this process, since it can be carried out by the same method as in the above mentioned photoresist layer for the second light emitting layer forming process, explanation is omitted here.

Moreover, this process may be executed after peeling off the photoresist layer for the second light emitting layer 3, remaining on the above mentioned second light emitting part 5', with the photoresist peeling solution or the like (photoresist layer for the second light emitting layer peeling process to be described later) for example as shown in FIG. 2G. Thereby, a preferable protecting layer can be formed. Moreover, at the time, since the first protecting layer is peeled off generally together with the photoresist layer for the second light emitting layer, the protecting layer may be formed simultaneously on the first light emitting part and the second light emitting part in the second protecting layer patterning process to be described later.

6. Second Protecting Layer Patterning Process

Next, the second protecting layer patterning process in the present invention will be explained. The second protecting layer patterning process in the present invention is a process of exposing the above mentioned second protecting layer so as not to bare the above mentioned second light emitting part and the end part thereof, and developing. As to the exposure and the development in the second protecting layer patterning, the patterning is executed so as to cover the light emitting part by a width larger than that of the above mentioned second light emitting part. That is, the second protecting layer is exposed and developed by a size to the extent capable of covering the end part of the light emitting part and also without covering the position where the adjacent light emitting part is to be formed. Thereby, the second light emitting part and the end part thereof can be protected by the second protecting layer. Therefore, the second light emitting part and the third light emitting layer are not contacted with each other at the time of forming the third light emitting part to be executed subsequently so that the elution of the second light emitting part into the third light emitting layer can be prevented so that a problem of the color mixture and the pixel narrowing can be prevented.

Here, since the exposure and the development method or the like in the second protecting layer patterning process can be executed by the same method as in the above mentioned photoresist layer for the second light emitting layer patterning process, explanation is omitted here.

In the case the first protecting layer is peeled off simultaneously with the photoresist for the second protecting layer by executing the photoresist layer for the second light emitting layer peeling process to be described later, the second protecting layer is formed also on the first light emitting part. At the time, although the second protecting layers to be formed on the first light emitting part and the second light emitting part may be provided independently for example as shown in FIG. 2I, but the second protecting layer formed on the first light emitting part 2 and the second protecting layer formed on the second light emitting part may be provided continuously.

7. Third Light Emitting Layer Forming Process

Next, the third light emitting layer forming process in the present invention will be explained. The third light emitting layer forming process in the present invention is a process of forming the third light emitting layer by coating the third light emitting layer forming coating solution onto the substrate provided with the first light emitting part protected by the above mentioned first protecting layer (or the second protecting layer) so as not to bare the first light emitting part and the end part thereof, and the second light emitting part protected so as not to bare the above mentioned second light emitting part and the end part thereof.

Since the third light emitting layer forming coating solution, the coating method thereof and the like comprising this process are same as those described in detail in the above mentioned "second light emitting layer forming process", explanation is omitted here.

8. Photoresist Layer for the Third Light Emitting Layer Forming Process

Next, the photoresist layer for the third light emitting layer forming process is executed in the present invention. The photoresist layer for the third light emitting layer forming process in the present invention is a process of forming the photoresist layer for the third light emitting layer by coating the photoresist onto the above mentioned third light emitting layer.

Since the photoresist, the coating method thereof and the like comprising this process are same as those described in detail in the above mentioned "photoresist for the second light emitting layer forming process", explanation is omitted here.

9. Photoresist Layer for the Third Light Emitting Layer Patterning Process

Next, the photoresist layer for the third light emitting layer patterning process in the present invention will be explained. The photoresist layer for the third light emitting layer patterning process in the present invention is a process of patterning such that only the photoresist layer for the third light emitting layer remains in the part where the third light emitting part is to be formed by the pattern exposure and the development of the above mentioned photoresist layer for the third light emitting layer.

Thereby, since the photoresist layer for the third light emitting layer is not remained on the fist light emitting part and the second light emitting part formed already on the substrate, and furthermore, the third light emitting layer bared by removing the photoresist layer for the third light emitting layer can be removed in the subsequent process, only each protecting layer, or each photoresist layer and each protecting layer are laminated on the first light emitting part and the second light emitting part.

Since the patterning method or the like comprising this process is same as that described in detail in the above mentioned "photoresist for the second light emitting layer patterning process", explanation is omitted here.

10. Third Light Emitting Part Forming Process

Next, the third light emitting part forming process in the present invention will be explained. The third light emitting part forming process in the present invention is a process of forming the patterned third light emitting part having the photoresist layer for the third light emitting layer on the surface by removing the third light emitting layer bared by removing the above mentioned photoresist layer for the third light emitting layer.

In the former process, since the photoresist layer for the third light emitting layer remains only in the part where the third light emitting part is to be formed, the third light emitting layer is formed by this process so as to remain only in the area where the third light emitting part is to be formed. Therefore, the photoresist layer for the third light emitting layer and the third light emitting layer are not remained on the first light emitting part and the second light emitting part already patterned so that the state in which an unnecessary layer is laminated on the first light emitting part and the second light emitting part can be avoided.

Moreover, the state in which the unnecessary layers placed on the first electrode layer are removed provides the effect of solving a problem of the film thickness irregularity derived from the lamination of plural layers or the like. Furthermore, since only the protecting layer, or the protecting layer and the photoresist layer to be peeled off later are laminated on the first light emitting part and the second light emitting part, the effect of quickly executing the peeling treatment of the photoresist layer and the protecting layer can also be achieved as well.

Since the method for forming the third light emitting part or the like in this process is same as that described in detail in the above mentioned "second light emitting part forming process", explanation is omitted here.

11. Peeling Process

In the present invention, by executing the peeling process or the like after the above mentioned third light emitting part forming process, the EL element can be manufactured. The "peeling process" here is a process of peeling off each photoresist layer and each protecting layer placed on each light emitting part with the photoresist peeling solution.

At the time, since only the protecting layer, or the photoresist layer and the protecting layer are formed on each light emitting part formed in a pattern on the substrate, and the protecting layers or the like are placed in the uppermost part, they can be peeled off easily using the photoresist peeling solution in this process.

As the peeling of the photoresist or the like in this process, the photoresist layer can be peeled off by a method of soaking the substrate in the photoresist peeling solution, the method of showering the photoresist peeling solution onto the substrate or the like.

As the peeling solution for the photoresist layer or the like used in the present invention, it is not particularly limited as long as it can dissolve the photoresist layer or the like without dissolving the above mentioned each light emitting layer, and the above mentioned solvents for the photoresist can be used as they are. Moreover, in a case a positive type photoresist is used, it is also possible to peel off using the solution presented as the photoresist developing agents after executing the ultraviolet ray exposure.

Furthermore, a solvent such as a strong alkaline aqueous solution, a dimethyl formamide, a dimethyl acetamide, a dimethyl sulfoxide, and an N-methyl-2-pyrrolidone, a mixture thereof, or a commercially available photoresist peeling solution can be used as well.

12. Others

In the present invention, after executing the photoresist layer for the second light emitting layer peeling process of peeling off the photoresist layer for the second light emitting layer formed on the above mentioned second light emitting part after the above mentioned second protection part forming process, the second protecting layer forming process may be executed. Thereby, the second protecting layer can be formed further preferably.

Moreover, the above mentioned each light emitting part may be formed on the buffer layer. Thereby, a conductive polymer having a function of flattening the ruggedness of the electrode or the like can be provided by for example improving the positive hole injection efficiency to the light emitting part.

Hereinafter, the photoresist layer for the second light emitting layer peeling process and the buffer layer will be explained.

(Photoresist Layer for the Second Light Emitting Layer Peeling Process)

First, the photoresist layer for the second light emitting layer peeling process in the present invention will be explained. The photoresist layer for the second light emitting layer peeling process in the present invention is a process of peeling off the photoresist layer for the second light emitting layer formed on the above mentioned second light emitting part after the above mentioned second light emitting part forming process. This process is a process of baring the second light emitting part $5'$ by removing the photoresist layer for the second light emitting layer 3 formed on the above mentioned second light emitting part $5'$ for example as shown in FIG. 2G. This is because it can be difficult to preferably form the second protecting layer in the case the photoresist layer for the second light emitting layer is formed. At the time, the first protecting layer may be peeled off simultaneously with the above mentioned photoresist layer for the second light emitting layer. Moreover, in the case the first protecting layer and the photoresist layer for the second light emitting layer are formed of different materials, they may not be peeled off is some cases.

Since peeling of the photoresist layer for the second light emitting layer in this process can be carried out by the same method or the like of the resist peeling solution used in the above mentioned "peeling process", explanation is omitted here.

(Buffer Layer)

Next, the buffer layer which can be used in the present invention will be explained. The buffer layer in the present invention may be provided on a substrate. The buffer layer states in the present invention is a layer containing an organic substance, in particular, an organic conductive pair, provided in between an anode and a light emitting part or a cathode and a light emitting part so as to facilitate injection of the charge into the light emitting part.

When the conductivity of the buffer layer used in the present invention is high, it is preferable that the layer is patterned so as to maintain the element diode property and to prevent cross talking. When the resistance of the buffer layer is high or the like, patterning is not necessary in some cases, and moreover, in the case of an element capable of omitting the buffer layer, the buffer layer is not necessary be provided in some cases.

In the present invention, it is preferable that the buffer layer is also patterned and formed by the photolithography method together with the above mentioned each light emitting layer. In this case, for a material forming the buffer layer, it is preferable to select material insoluble to the photoresist solvent and to the solvent used for the light emitting layer formation. More preferably, it is the case of selecting a material forming the buffer layer which is insoluble to the photoresist peeling solution.

As the material forming the buffer layer used in the present invention, specifically, polymers of a positive hole transporting substance such as a polyalkyl thiophene derivative, a polyaniline derivative and a triphenyl amine, sol-gel films of an inorganic oxide, polymer films of an organic substance such as a trifluoro methane, organic compound films containing a Lewis acid and the like can be presented, but it is not particularly limited as long as it satisfies the above mentioned conditions concerning the solubility, and it may satisfy the above mentioned conditions by reaction, polymerization, baking or the like after the film formation.

Moreover, in the present invention, as the solvent used at the time of forming the buffer layer, one having the buffer material dispersed or dissolved can be used, and it is not particularly limited. When plural times of the film formation is necessary in full color patterning or the like, it is necessary to use a buffer layer solvent not to dissolve the photoresist material, and it is further preferable to use a buffer layer solvent not to dissolve the light emitting layer.

As the buffer layer solvent usable in the present invention, it is preferable to select a solvent having a solubility of the resist material at 25° C. and 1 atmospheric pressure of 0.001 (g/g solvent) or less, and it is further preferable to select a solvent having a solubility of 0.0001 (g/g solvent) or less. Moreover, as the buffer layer solvent, it is further preferable to select a solvent having a solubility of the light emitting layer component material at 25° C. and 1 atmospheric pressure of 0.001 (g/g solvent) or less, and it is particularly preferable to select a solvent having a solubility of 0.0001 (g/g solvent) or less.

Specifically, water, alcohols such as a methanol and an ethanol, and solvents such as a dimethyl formamide, a dimethyl acetamide, a dimethyl sulfoxide, and an N-methyl-2-pyrrolidone can be presented. Other solvents capable of satisfying the conditions can be used as well. Moreover, a mixture of two or more kinds of solvents can be used as well.

As needed, a buffer layer insoluble to a solvent using a hardening type resin or the like may be used as well. Specifically, a sol-gel reacting solution, a photo setting resin or a thermosetting resin can be presented. That is, a buffer layer insoluble to a solvent can be used by using a buffer layer forming coating solution with an additive, for acting as a buffer layer, added to a sol-gel reacting solution, a photo setting resin or a thermosetting resin in an unhardened state, or a buffer layer forming coating solution prepared so as to act as a buffer layer by denaturing a sol-gel reacting solution, a photo setting resin or a thermosetting resin itself, and hardening the buffer layer forming coating solution or the like.

The present invention is not limited to the above mentioned embodiments. The above mentioned embodiments are examples, and any one having the substantially same configuration as the technological idea disclosed in the claims of the present invention and providing the same effects is included in the technological scope of the present invention.

EXAMPLES

With reference to the example, the present invention will further be explained.

Example

Film Formation of the First Buffer Layer

By cleaning a patterned ITO substrate of a 6 inch square and 1.1 mm plate thickness, a substrate and a first electrode layer were provided. 0.5 ml of a buffer layer coating solution (manufactured by Bayer: Baytron P) was taken and dropped onto the central part of the substrate and executed a spin coating. By maintaining at 2,000 rpm for 10 seconds, a buffer layer was formed. As a result, the film thickness was 800 Å.

(Formation of the First Light Emitting Layer)

Next, as the first light emitting layer, 1 ml of a coating solution (70 parts by weight of a polyvinyl carbazol, 30 parts by weight of an oxadiazol, 1 part by weight of a dicyanomethylene pyran derivative, 4,900 parts by weight of a monochloro benzene) as a red color light emitting organic material was taken and dropped onto the central part of the substrate on the buffer layer and executed a spin coating. By maintaining at 2,500 rpm for 20 seconds, a first light emitting layer was formed. As a result, the film thickness was 800 Å.

Next, 2 ml of a positive type photoresist (manufactured by Tokyo Ohka Kogyo Co., Ltd.: OFPR-800) was taken on the first light emitting layer, dropped onto the central part of the substrate and executed a spin coating. By maintaining at 500 rpm for 10 seconds, and then at 2,000 rpm for 20 seconds, a photoresist layer for the first light emitting layer was formed. As a result, the film thickness was about 1 μm. Subsequently, pre-baking was executed at 80° C. for 30 minutes.

Thereafter, the above was set on an alignment exposing machine together with an exposure mask for the ultraviolet ray irradiation to the part other than the first light emitting part, where the first light emitting layer is to be removed. After developing for 20 seconds with a resist developing agent (manufactured by Tokyo Ohka Kogyo Co., Ltd.: NMD-3), it was cleaned with water for removing the photoresist layer in the exposed part.

Subsequently, after post-baking at 120° C. for 30 minutes, the buffer layer and the light emitting layer, on the part where the photoresist layer is removed were removed by the reactive ion etching using oxygen plasma, are removed.

Next, after removing the photoresist with an acetone, again, 2 ml of a positive type photoresist (manufactured by Tokyo Ohka Kogyo Co., Ltd.: OFPR-800) was taken and dropped onto the central part of the substrate and executed a spin coating. By maintaining at 500 rpm for 10 seconds, and then at 2,000 rpm for 20 seconds, a first protecting layer was formed. As a result, the film thickness was about 1 μm. Subsequently, pre-baking was executed at 80° C. for 30 minutes. Thereafter, the above was set on the alignment exposing machine together with an exposure mask for the ultraviolet ray irradiation so as to have the photoresist layer, of a width larger than the width of the first light emitting part by 10 μm each, is to be ramained. After developing for 20 seconds with a resist developing agent (manufactured by Tokyo Ohka Kogyo Co., Ltd.: NMD-3), it was cleaned with water to remove the photoresist layer in the exposed part. Furthermore, by post-baking at 120° C. for 30 minutes, the substrate where in the first light emitting part is protected by the photoresist layer having with a width larger than the width of the first light emitting part by 10 μm each was obtained.

(Film Formation of the Second Buffer Layer)

0.5 ml of a buffer layer coating solution (manufactured by Bayer.: Baytron P) was taken and dropped onto the central part of the obtained substrate to form a second buffer layer by maintaining at 2,500 rpm for 20 seconds by the spin coating method. As a result, the film thickness was 800 Å.

(Film Formation of the Second Light Emitting Layer)

As the second light emitting layer, 1 ml of a coating solution (70 parts by weight of a polyvinyl carbazol, 30 parts by weight of an oxadiazol, 1 part by weight of a coumarine 6, 4,900 parts by weight of a monochloro benzene) as a green color light emitting organic material was taken, dropped onto the central part of the substrate on the above mentioned buffer layer and executed a spin coating. By maintaining at 2,000 rpm for 10 seconds, a second light emitting layer was formed. As a result, the film thickness was about 800 Å.

Next, 2 ml of a positive type photoresist (manufactured by Tokyo Ohka Kogyo Co., Ltd.: OFPR-800) was taken on the second light emitting layer, dropped onto the central part of the substrate and executed spin coating. By maintaining at 500 rpm for 10 seconds, and then at 2,000 rpm for 20 seconds, a photoresist layer for the second light emitting layer was formed. As a result, the film thickness was about 1 μm. Subsequently, pre-baking was executed at 80° C. for 30 minutes.

Subsequently, the above was set on the alignment exposing machine together with an exposure mask for the ultraviolet ray irradiation to the part other than the second light emitting part where the second light emitting layer is to be removed. After developing for 20 seconds with a resist developing agent (manufactured by Tokyo Ohka Kogyo Co., Ltd.: NMD-3), it was cleaned with water for removing the photoresist layer of the exposed part.

Subsequently, after post-baking at 120° C. for 30 minutes, the buffer layer and the light emitting layer, in the part where the photoresist layer is removed, were removed by the reactive ion etching using oxygen plasma.

Next, after removing the photoresist and the protecting layer with an acetone, again, 2 ml of a positive type photoresist (manufactured by Tokyo Ohka Kogyo Co., Ltd.: OFPR-800) was taken and dropped onto the central part of the substrate and executed a spin coating. By maintaining at 500 rpm for 10 seconds, and then at 2,000 rpm for 20 seconds, a second protecting layer was formed on the first light emitting part and the second light emitting part. As a result, the film thickness was about 1 μm. Subsequently, pre-baking was executed at 80° C. for 30 minutes. Thereafter, the above was set on the alignment exposing machine together with an exposure mask for the ultraviolet ray irradiation so as to have the photoresist layer of a width larger than the width of the second light emitting part by 10 μm each remained. After developing for 20 seconds with a resist developing agent (manufactured by Tokyo Ohka Kogyo Co., Ltd.: NMD-3), it was cleaned with water to remove the photoresist of the exposed part. Furthermore, by post-baking at 120° C. for 30 minutes, the substrate wherein the second light emitting part is protected by the protecting layer with a width larger than the width of the second light emitting part by 10 μm each was obtained.

(Film Formation of the Third Buffer Layer)

0.5 ml of a buffer layer coating solution (manufactured by Bayer: Baytron P) was taken on the above mentioned substrate, dropped onto the central part of the substrate and executed a spin coating. By maintaining at 2,500 rpm for 20 seconds, a buffer layer was formed. As a result, the film thickness was 800 Å.

(Formation of the Third Light Emitting Layer)

As the third light emitting layer, 1 ml of a coating solution (70 parts by weight of a polyvinyl carbazol, 30 parts by weight of an oxadiazol, 1 part by weight of a perylene, 4,900 parts by weight of a monochloro benzene) as a blue color light emitting organic material was taken, dropped onto the central part of the substrate on the buffer layer and executed a spin coating. By maintaining at 2,000 rpm for 10 seconds, a third light emitting layer was formed. As a result, the film thickness was 800 Å.

Next, 2 ml of a positive type photoresist solution (manufactured by Tokyo Ohka Kogyo Co., Ltd.: OFPR-800) was taken on the third light emitting layer, dropped onto the central part of the substrate and executed a spin coating. By maintaining at 500 rpm for 10 seconds, and then at 2,000 rpm for 20 seconds, a photoresist layer for the third light emitting layer was formed. As a result, the film thickness was about 1 μm. Subsequently, pre-baking was executed at 80° C. for 30 minutes.

Thereafter, the above was set on the alignment exposing machine together with an exposure mask for the ultraviolet ray irradiation in the part other than the third light emitting part, where the third light emitting layer is to be removed. After developing for 20 seconds with a resist developing agent (manufactured by Tokyo Ohka Kogyo Co., Ltd.: NMD-3), it was cleaned with water to remove the photoresist layer of the exposed part.

Subsequently, after post-baking at 120° C. for 30 minutes, the buffer layer and the light emitting layer, in the part where the photoresist layer is removed, were removed by the reactive ion etching using oxygen plasma so as to obtain the substrate wherein the first light emitting part, the second light emitting part and the third light emitting part protected by the photoresist was obtained. Thereafter, the photoresist was totally removed with an acetone so as to bare the patterned light emitting layer.

After drying at 100° C. for 1 hour, by vapor depositing a Ca by 500 Å thickness as the second electrode layer on the obtained substrate, and further vapor depositing an Ag by 2,500 Å thickness as the protecting layer, an EL element was manufactured.

(Evaluation of the Light Emitting Property of the EL Element)

With the ITO electrode side connected to the positive electrode and the Ag electrode side to the negative electrode, a direct current was applied by a source meter. Light emission was observed from each of the first, second, and third light emitting part when 10 V was applied.

What is claimed is:

1. A method for manufacturing an electroluminescent element using a photolithography method comprising:
    a heterochromatic light emitting layer forming process of forming a heterochromatic light emitting layer on a substrate, provided with a light emitting part of at least one color and a protecting layer formed so that the light emitting part and the sidewall portion thereof are not bared, by coating a heterochromatic light emitting layer forming coating solution showing a color different from the light emitting part;
    a photoresist layer for the heterochromatic light emitting layer forming process of forming a photoresist layer for the heterochromatic light emitting layer by coating a photoresist on the heterochromatic light emitting layer;

a photoresist layer for the heterochromatic light emitting layer patterning process of patterning the photoresist layer for the heterochromatic light emitting layer by pattern exposure and development so as only the photoresist layer for the heterochromatic light emitting layer of a part where the heterochromatic light emitting part is to be formed will remain;

a heterochromatic light emitting part forming process of forming a patterned heterochromatic light emitting part having a photoresist layer for the heterochromatic light emitting layer on the surface by removing the heterochromatic light emitting layer bared by removing the photoresist layer for the heterochromatic light emitting layer;

a protecting layer for the heterochromatic light emitting layer forming process of forming a protecting layer for the heterochromatic light emitting layer by coating a protecting layer forming coating solution so as to cover the heterochromatic light emitting part; and a protecting layer for the heterochromatic light emitting layer patterning process of exposing and developing the protecting layer for the heterochromatic light emitting layer so as not to bare the heterochromatic light emitting part and the sidewall portion thereof.

2. The method for manufacturing an electroluminescent element according to claim 1 wherein, after the heterochromatic light emitting part forming process, a photoresist for the heterochromatic light emitting layer peeling process of peeling off the photoresist layer for the heterochromatic light emitting layer remaining on the heterochromatic light emitting part is carried out, and then, the protecting layer for the heterochromatic light emitting layer forming process is carried out.

3. The method for manufacturing an electroluminescent element according to claim 1 wherein each light emitting part is patterned together with buffer layers, and formed on the buffer layers.

4. The method for manufacturing an electroluminescent element according to claim 1 using a photolithography method wherein each light emitting part forming process is a process of patterning each light emitting layer of a part where each photoresist layer is removed by using dry etching.

5. The method for manufacturing an electroluminescent element according to claim 4 wherein the dry etching is a reactive ion etching.

6. The method for manufacturing an electroluminescent element according to claim 4 wherein oxygen alone or a gas containing oxygen is used for the dry etching.

7. The method for manufacturing an electroluminescent element according to claim 4 wherein atmospheric pressure plasma is used for the dry etching.

8. The method for manufacturing an electroluminescent element according to claim 1, wherein, in the protecting layer for the heterochromatic light emitting layer patterning process, the protecting layer for the heterochromatic light emitting layer is exposed and developed so as the developed protecting layer for the heterochromatic light emitting layer covers the heterochromatic light emitting part by a width larger than the width of the heterochromatic light emitting part and by a size to the extent not covering the light emitting part.

9. A method for manufacturing an electroluminescent element using a photolithography method comprising:

a second light emitting layer forming process of forming a second light emitting layer by coating a second light emitting layer forming coating solution on a substrate provided with a first light emitting part and a first protecting layer formed so as not to bare the first light emitting part and the sidewall portion thereof;

a photoresist layer for the second light emitting layer forming process of forming a photoresist layer for the second light emitting layer by coating a photoresist on the second light emitting layer;

a photoresist layer for the second light emitting layer patterning process of patterning by pattern exposure and development of the photoresist layer for the second light emitting layer so as only the photoresist layer for the second light emitting layer of a part where the second light emitting part is to be formed will remain;

a second light emitting part forming process of forming a patterned second light emitting part having a photoresist layer for the second light emitting layer on the surface by removing the second light emitting layer bared by removing the photoresist layer for the second light emitting layer a second protecting layer forming process of forming a second protecting layer by coating a protecting layer forming coating solution so as to cover the second light emitting part;

a second protecting layer patterning process of exposing and developing the second protecting layer so as not to bare the second light emitting part and the sidewall portion thereof;

a third light emitting layer forming process of forming a third light emitting layer on a substrate, provided with the first light emitting part, the first protecting layer formed so that the first light emitting part and the sidewall portion thereof are not bared, the second light emitting part and the second protecting layer formed so that the second light emitting part and the sidewall portion thereof are not bared, by coating a third light emitting layer forming coating solution;

a photoresist layer for the third light emitting layer forming process of forming a photoresist layer for the third light emitting layer by coating a photoresist on the third light emitting layer;

a photoresist layer for the third light emitting layer patterning process of patterning the photoresist layer for the third light emitting layer by pattern exposure and development so as only the photoresist layer for the third light emitting layer of a part where the third light emitting part is to be formed will remain;

a third light emitting part forming process of forming a patterned third light emitting part having a photoresist layer for the third light emitting layer on the surface by removing the third light emitting layer bared by removing the photoresist layer for the third light emitting layer.

10. The method for manufacturing an electroluminescent element according to claim 9 wherein, after the second light emitting part forming process, a photoresist for the second light emitting layer peeling process of peeling off the photoresist layer for the second light emitting layer remaining on the second light emitting part is carried out, and then, the second protecting layer forming process is carried out.

11. The method for manufacturing an electroluminescent element according to claim 9 wherein each light emitting part is patterned together with buffer layers, and formed on the buffer layers.

12. The method for manufacturing an electroluminescent element according to claim 9 using a photolithography method wherein each light emitting part forming process is a process of patterning each light emitting layer of a part where each photoresist layer is removed by using dry etching.

13. The method for manufacturing an electroluminescent element according to claim 12 wherein the dry etching is a reactive ion etching.

14. The method for manufacturing an electroluminescent element according to claim 12 wherein oxygen alone or a gas containing oxygen is used for the dry etching.

15. The method for manufacturing an electroluminescent element according to claim 12 wherein atmospheric pressure plasma is used for the dry etching.

* * * * *